United States Patent [19]
Parvathala et al.

[11] Patent Number: 6,032,278
[45] Date of Patent: *Feb. 29, 2000

[54] METHOD AND APPARATUS FOR PERFORMING SCAN TESTING

[75] Inventors: Praveen Parvathala, Phoenix, Ariz.;
Fred Gruner, Palo Alto, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/787,824

[22] Filed: Dec. 26, 1996

[51] Int. Cl.[7] .................................................. G01R 31/28
[52] U.S. Cl. ............................................ 714/726; 365/201
[58] Field of Search ............................. 371/22.31, 22.32, 371/22.34, 22.36, 22.5, 27.7; 395/183.06, 183.01, 183.15; 324/758; 307/272.02; 714/726, 727, 729, 731, 733, 30; 365/201

[56] References Cited

U.S. PATENT DOCUMENTS

| | | | |
|---|---|---|---|
| 5,459,736 | 10/1995 | Nakamura | 371/22.3 |
| 5,477,545 | 12/1995 | Huang | 371/22.3 |
| 5,519,714 | 5/1996 | Nakamura et al. | 371/22.3 |
| 5,610,927 | 3/1997 | Segars | 371/22.3 |
| 5,617,426 | 4/1997 | Koenemann et al. | 371/22.3 |
| 5,619,511 | 4/1997 | Sugisawa et al. | 371/22.3 |
| 5,663,966 | 9/1997 | Day et al. | 371/22.36 |
| 5,719,877 | 2/1998 | Warren | 371/22.3 |
| 5,719,878 | 2/1998 | Yu et al. | 371/22.3 |

*Primary Examiner*—Robert W. Beausoliel, Jr.
*Assistant Examiner*—Nadeem Iqbal
*Attorney, Agent, or Firm*—Blakely, Sokoloff, Taylor & Zafman LLP

[57] ABSTRACT

A method and apparatus for providing a scan cell having a first input coupled to receive a data, a data output and a scan output. The scan cell being capable of transferring data to said scan output in response to a first scan clock and a second scan clock without requiring any timing-sensitive control signals.

13 Claims, 5 Drawing Sheets

METHOD AND APPARATUS FOR PERFORMING SCAN TESTING

BACKGROUND OF THE INVENTION

1. Field of the Invention

The present invention relates to the field of scan testing; more particularly, the present invention relates to a method and apparatus for performing scan testing that reduces the number of control signals, avoids bus contention, and reduces the number of constraints in test generation.

2. Description of Related Art

A typical integrated circuit has combinational logic blocks which are coupled through latches controlled by a system clock. In order to test the functionality and performance of a combinational logic block, various combinations of stimulus conditions are selected according to well-known methods. In order to apply the desired stimulus to a combinational logic block, a sequence of operations may need to be performed. In a complex integrated circuit, the time to apply this sequence of operations to apply this stimulus can be burdensome.

Internal scan testing is a well-known technique to serially accept data that is applied to critical inputs of these combinational logic blocks. The ability to directly control internal signals simplifies the preparation process for a test of the combinational logic. Multiple scan cells are serially coupled to produce the scan chain. Each of the scan cells also have an input that is coupled to an output of one combinational logic block and an output that is coupled to the input of another combinational logic block.

The following method is used to perform stuck-at fault testing. First, a sequence of bits are applied to the head of the scan chain until all the scan cells have been initialized to the proper value. Second, each scan cell applies the data to the input of the corresponding combination block in response to a first pulse on the system clock. Third, another scan cell samples an output of that combinational block in response to a second pulse on the system clock. Fourth, the responses of the combinational blocks are serially shifted out of the tail of the scan chain to be compared against expected values. Should there be a fault on a critical signal of that combinational block, the response will not correspond to the expected value and the device will fail the test. Faults include open circuits, short circuits, and aberrations in resistance and/or capacitance, for example.

Alternatively, some scan cells are capable of generating a transition on the input of the combinational logic block to enable testing of the performance (delay) of the combinational logic block to determine the maximum frequency of operation. The following method is used to perform delay fault testing. First, the initial values and their complements are loaded into latches within each scan cell. Second, the initial value is applied to the input of the corresponding combination block in response to a first clock pulse on the system clock. Third, the final value is applied to the input of the corresponding combination block (thereby generating a transition) in response to a second clock pulse on the system clock. Fourth, another scan cell samples an output of that combinational block in response to a third clock pulse on the system clock. Fifth, the responses of the combinational blocks are serially shifted out of the tail of the scan chain to be compared against expected values. The time between the second clock pulse and the third clock pulse can be gradually decreased and the test repeated until the response sampled is incorrect. The minimum passing time would correspond to the minimum period of operation of that combinational logic block for that particular stimulus. By applying a sequence of various worst case stimulus conditions, the maximum frequency of operation may be determined.

One apparatus for performing internal scan is illustrated in FIG. 1. It is described more fully in "Design For Testability: Using Scanpath Techniques For Path Delay Test and Measurement," Institute of Electrical & Electronic Engineers (IEEE) International Test Conference 1991, pp. 365–374, by B. Dervisoglu and G. Strong.

A master latch 100 is coupled to receive a data (D) signal which is an output from a first combinational logic block. This D signal is latched in response to an active-low enable signal (EN1#). A logic OR gate 130 is coupled to receive a system clock and a double-strobe (DS) control signal and generate the EN1# signal. The master latch 100 is also coupled to receive a scan-in (SI) signal which is strobed in response to a master load (ML) control signal. The output (Q1#) signal is the complement of the latched signal.

A slave latch 110 is coupled to latch the Q1# signal in response to the system clock. In addition, the slave latch 110 is coupled to latch the scan-in (SI) signal in response to a scan-in clock (SI_CLK). The slave latch 110 generates the latched signal (Q2) and its complement (Q). The Q signal is coupled to an input of a second combinational block. Since the D and SI signals are complemented by the master latch 100 and then complemented by the slave latch 110, the resulting signal is the input signal and not its complement.

A scan slave latch 120 is coupled to latch the Q2 signal in response to a scan-out clock (SO_CLK). The scan slave latch 120 drives the latched data on a scan-out (SO) signal. The SI signal that is latched by the slave latch 110 and then by the scan slave latch 120 is not complemented. However, the D signal is complemented by the master latch 100. When the complement of the D signal is serially scanned out through the slave latch 110 and the scan slave latch 120 for comparison with the expected response, it remains the complement of the D signal. External logic that is used to analyze the scan results must test for the complement of the expected combinational logic block outputs.

During normal functional operation, the DS and ML control signals are deasserted. The output of the first combinational logic block is latched by the master latch 100 to generate the Q1# signal in response to the system clock being deasserted. The Q1# signal is latched by the slave latch 110 to generate the Q signal in response to the system clock being asserted. The Q signal is applied to the input of the second combinational logic block. Therefore, in the normal functional mode of operation, an output of the first combinational logic block is driven to an input of the next combinational logic block on each rising edge of the clock signal.

During stuck at fault testing, the DS and ML control signals are deasserted. Each scan cell is initialized by scanning in data through the slave latch 110 and then through the scan slave latch 120 by applying an alternating sequence of pulses of the SI_CLK and the SO_CLK signals. Note that as the values serially shift through the slave latch 110, the Q signal (which is the input to the second combinational logic block) toggles according to the value being shifted through the scan cell. By applying the CLK signal, the master latch of another scan cell samples the response of the second combinational logic block to the test data is applied. The sampled values for each scan cell is then shifted through the scan chain for comparison with expected values by applying an alternating sequence of pulses of the SI_CLK and the SO_CLK signals.

During delay fault testing, the slave latch 110 is initialized with the initial value and the master latch is initialized with the complement of the final value of the input to define a transition (from initial value to final value) which is to be applied to the second combination logic block. The DS and ML control signals are asserted to cause the master latch 100 and the slave latch 110 to latch the same SI signal in response to the SI_CLK signal. However, since the SI signal is inverted once by the slave latch 110 to produce the initial value and the SI signal is inverted twice by the master latch 100 and the slave latch 110 to produce the final value, the initial value is the complement of the SI signal and the final value is the SI signal. As in the case of stuck at fault testing, as the values serially shift through the slave latch 110, the Q signal (which is the input to the second combinational logic block) toggles according to the value being shifted through the scan cell. When the scan is complete the transition is applied to the input of the second combinational logic block in response to a first pulse of the system clock. The DS signal must be deasserted after the first pulse because otherwise the D signal may corrupt the final value latched by the master latch 100. The master latch of another scan cell samples the output of the second combinational logic block in response to a second pulse of the system clock. The DS signal must be deasserted before the second pulse of the system clock in order to enable the master latch 100 to latch the response of the second combinational logic block. The sampled values for each scan cell is then shifted through the scan chain for comparison with expected values. The time between the first and second pulses of the system clock is gradually reduced and the test repeated until the device does not produce the expected values.

One problem with the scan cell described above is that two control signals (the DS and ML signals) are required to operate the scan cell. A reduction of signals required to perform internal scan testing is particularly desirable because it reduces the number of signals that need to be routed to each scan cell. The reduction of control signals also reduces complexity of scan control logic.

Furthermore, the DS control signal is timing sensitive in that it must be deasserted after the first pulse of the system clock but before the second pulse of the system clock. Timing sensitive control signals add complexity and cost to the design of the integrated circuit and the external system that drives the timing sensitive control signal by requiring that the control signal be carefully routed.

Another problem with the scan cell described above is that the input to the combinational logic blocks transition as data is scanned through the scan chain. A scan cell that toggles the input of the combinational logic block during scan shift operations is known as a destructive scan cell. In some cases, the random combinations that are applied to the inputs of the combinational logic blocks during the serial scan operations may cause bus contention problems. For example, if two scan cells drive different select inputs to a multiplexer and both cells happen to enable their corresponding select inputs at the same time as the data is being scanned through the scan chain, the multiplexer would be allowing two inputs to simultaneously drive the same bus. If these inputs happen to be driving the bus to different logic values, a direct-current (DC) path from power to ground is created which increases power consumption and may lead to reliability problems. It is desirable to use a scan cell that does not toggle the input of the combinational logic block during scan shift (a non-destructive scan cell).

A disadvantage of using destructive scan cells to perform transitional fault testing is that some combinations of transitions may not be available due to test constraints. In one method of transitional fault testing, the transition stimulus is applied to the combinational logic blocks in response to the last assertion of the scan clock signal during the shift sequence. For example, assume that there is a scan cell A coupled to a scan cell B to form a scan cell chain and the data sequence of D1, D2, and D3 is applied to the scan chain. On the last assertion of the scan clock, scan cell A transitions from D2 to D3 and scan cell B transitions from D1 to D2. Note that D2 is used to define the transition of scan cell A and the transition of scan cell B. Therefore, this method cannot be used to cause the value scan cell A transitions from and the value scan cell B transitions to, to be different. Such a combination of transitions may be desired.

In another method of transitional fault testing, a first value is scanned into a first scan latch and a second value is scanned into a second scan latch. In response to a first system clock, the first value is applied to a first combinational logic block and the second value is applied to a second combinational logic block (the block to be tested). The second scan latch receives an output of the first combinational logic block (third value) and applies that output to the second combinational logic block in response to a second system clock. Thus, the input to the second combinational block transitions from the second value to the third value in response to the second system clock and an output of the second combinational logic block is latched by a third scan latch in response to a third system clock. One disadvantage of this method is that automatic test program generation (ATPG) tools that determine the combination of transitions that are desired to test to the second combinational logic block must evaluate both the first combinational logic block and the second combinational logic block to determine the first and second values which will generate the desired transition. This requires a more complex ATPG tool and more simulation time to generate test sequences.

What is needed is a method and apparatus to perform stuck-at and delay fault testing using internal scan cells without requiring control signals, particularly timing sensitive control signals, and without toggling the output driving a combinational logic block during serial scan operations.

SUMMARY OF THE INVENTION

A method and apparatus for providing a scan cell having a first input coupled to receive a data, a data output and a scan output. The scan cell being capable of transferring data to said scan output in response to a first scan clock and a second scan clock without requiring any timing-sensitive control signals.

DETAILED DESCRIPTION

The present invention provides the ability to perform stuck-at and delay fault testing using internal scan cells without requiring the use of control signals, particularly timing sensitive control signals. In addition, one embodiment of the present invention avoids toggling the outputs of scan cells and the corresponding inputs of the combinational logic blocks during serial scan operations to avoid bus contention.

Figure 1:
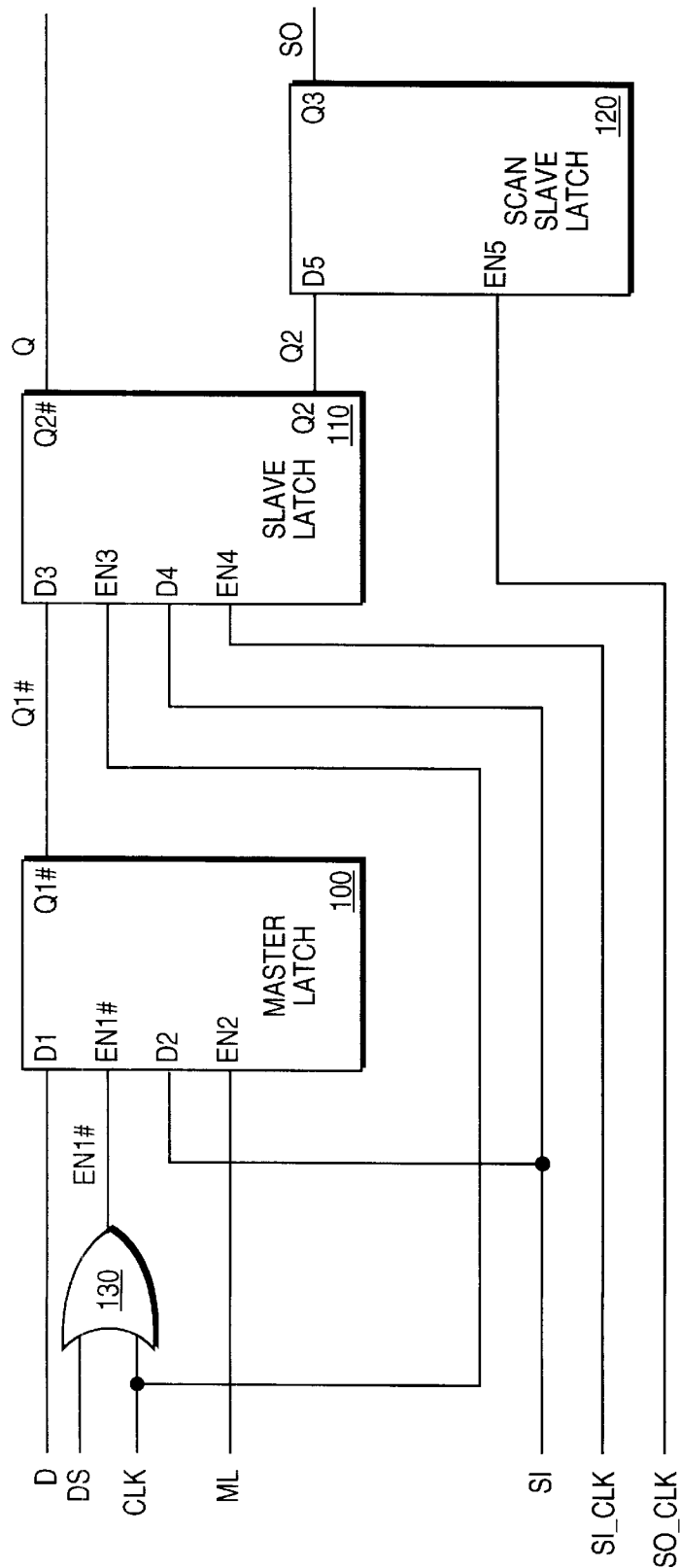
FIG. 1 illustrates a prior art scan cell.
Figure 2:
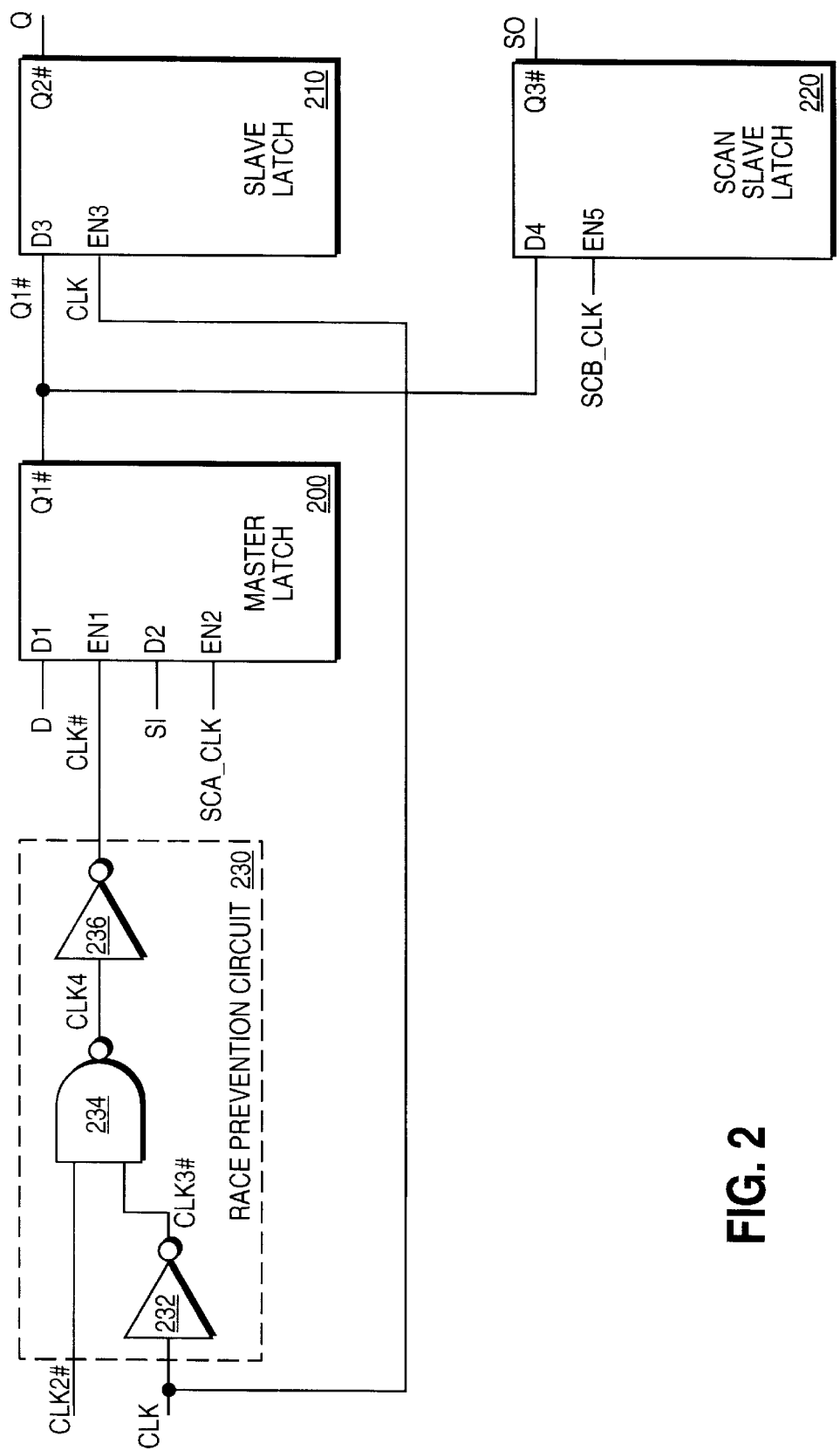
FIG. 2 illustrates one embodiment of a scan cell of the present invention.

FIG. 2 illustrates one embodiment of the apparatus of the present invention.

A master latch 200 is coupled to receive a data (D) signal which is an output from a first combinational logic block. The D signal is latched in response to a first system clock (CLK#) signal. The master latch 200 is also coupled to receive a scan-in (SI) signal which is strobed in response to a scan A clock (SCA_CLK) signal. The output (Q1#) signal is the complement of the latched D or SI signal.

A slave latch 210 is coupled to latch the Q1# signal in response to a second system clock (CLK) signal. The slave latch 210 generates a latched signal (Q) that is the complement of the latched Q1# signal. The Q signal is coupled to an signal of a second combinational block. Since the D and SI signals are complemented by the master latch 200 and then complemented by the slave latch 210, the resulting signal is the D or SI signal and not their complement.

A scan slave latch 220 is coupled to latch the Q1# signal in response to a scan B clock (SCB_CLK). The scan slave latch 220 drives the latched data to generate a scan-out (SO) signal. The D signal that is latched by the master latch 200 and then by the slave latch 210 is not complemented. The SI signal that is latched by the master latch 200 and then by the scan slave latch 220 is also not complemented. Therefore, when the response data is serially scanned out for comparison with the expected response, external logic that is used to analyze the scan results tests for the expected combinational logic block outputs not its complement as in the prior art example.

During normal functional operation, the SCA_CLK and SCB_CLK signals are deasserted. An output of the first combinational logic block is latched by the master latch 200 to generate the Q1# signal in response to the CLK# signal being asserted. The Q1# signal is latched by the slave latch 210 to generate the Q signal in response to the CLK signal being asserted. The Q signal is applied to an input of the second combinational logic block. Therefore, in the normal functional mode of operation, an output of the first combinational logic block is driven to an input of the second combinational logic block in response to the CLK# and CLK signals being asserted in sequence.

During stuck at fault testing, a sequence of alternating pulses of the SCA_CLK and the SCB_CLK signals are used to serially shift the initial values on the SI signal through the master latch 200 and the scan slave latch 220. During initialization for stuck at fault testing, the CLK and CLK# signals are both deasserted. Note that as the values serially shift through the master latch 200 and the scan slave latch 220, the Q signal (which is the input to the second combinational logic block) is not effected. When the scan is complete the test data is applied to the input of the second combinational logic block by applying a pulse of the CLK signal. By applying a pulse of the CLK# signal, the master latch of another scan cell samples the output of the second combinational logic block. The sampled values for each scan cell is then shifted through the scan chain for comparison with expected values by applying a sequence of pulses on the SCA_CLK and SCB_CLK signals.

During delay fault testing, a sequence of alternating pulses of the SCA_CLK and the SCB_CLK signals are used to serially shift in the initial values on the SI signal through the master latch 200 and the scan slave latch 220. During initialization for delay fault testing, the CLK and CLK# signals are both deasserted except to load the initial value into the slave latch 210 as described below. A pulse of the CLK signal is applied to cause the slave latch 210 to latch the initial value onto the Q signal. Then another sequence of alternating pulses of the SCA_CLK and the SCB_CLK signals are used to serially shift in the final values on the SI signal through the master latch 200 and the scan slave latch 220 to define a transition (from initial value to final value) which is to be applied to the second combination logic block. As in the case of stuck at fault testing, as the values serially shift through the slave latch 110, the Q signal (which is the input to the second combinational logic block) remains constant. When the scan is complete the transition is applied to the input of the second combinational logic block in response to a first pulse of the CLK signal. The master latch of another scan cell samples the output of the second combinational logic block in response to the CLK# signal. The sampled values for each scan cell is then shifted through the scan chain for comparison with expected values. The time between the first and second pulses of the system clock is gradually reduced until the device does not produce the expected values. The last passing time corresponds to the maximum frequency of operation for that test stimulus.

The CLK and CLK# signals are non-overlapping independently controlled clock signals. Preferably, a race prevention circuit 230 is coupled to receive the CLK signal and a CLK2# signal which are not necessarily non-overlapping to produce a CLK signal and CLK# signal that is non-overlapping. A race condition occurs when two sequential latches are enabled simultaneously, thereby allowing an input signal to "race" through two latches in a single clock cycle and cause corruption of data. In one embodiment, a logical inverter 232 is coupled to receive the CLK signal and generate a CLK3# signal. A logical NAND gate 234 is coupled to receive the CLK2# signal and the CLK3# signal to produce a CLK4 signal. An inverter 236 is coupled to receive the CLK4 signal to produce the CLK# signal. If the CLK2# signal and the CLK signal is asserted simultaneously, the CLK signal disables the assertion of the CLK# signal in response to the CLK2# signal. The CLK signal and CLK# signal must be independently controlled so that both can be continuously deasserted at the same time during stuck at and delay fault testing. During normal operation, CLK and CLK# signals are alternately asserted. In one embodiment, there is a period of time between each assertion of the clock signals in which neither clock is asserted. In another embodiment, one of the two clock signals is always asserted during normal operation.

The scan cell illustrated in FIG. 2 does not require additional control signals. The reduction of signals required to perform internal scan testing reduces the number of signals that need to be routed to each scan cell and, if timing sensitive signals are eliminated, it reduces the number of signals that need to be synchronized. The reduction of control signals reduces complexity and area of scan control logic.

Furthermore, by eliminating timing sensitive signals such as the DS control signal of the prior art example, design of the integrated circuit is simplified and the cost (area) is reduced. Also, since the output to the combinational logic does not transition while the serial scan operation is being performed, bus contention issues are avoided.

In addition, by permitting the initial value and the final value to be independently loaded into each scan cell, the dependency between transitions of different scan cells is eliminated. Thus, all combinations of transitions may be generated.

Figure 3:
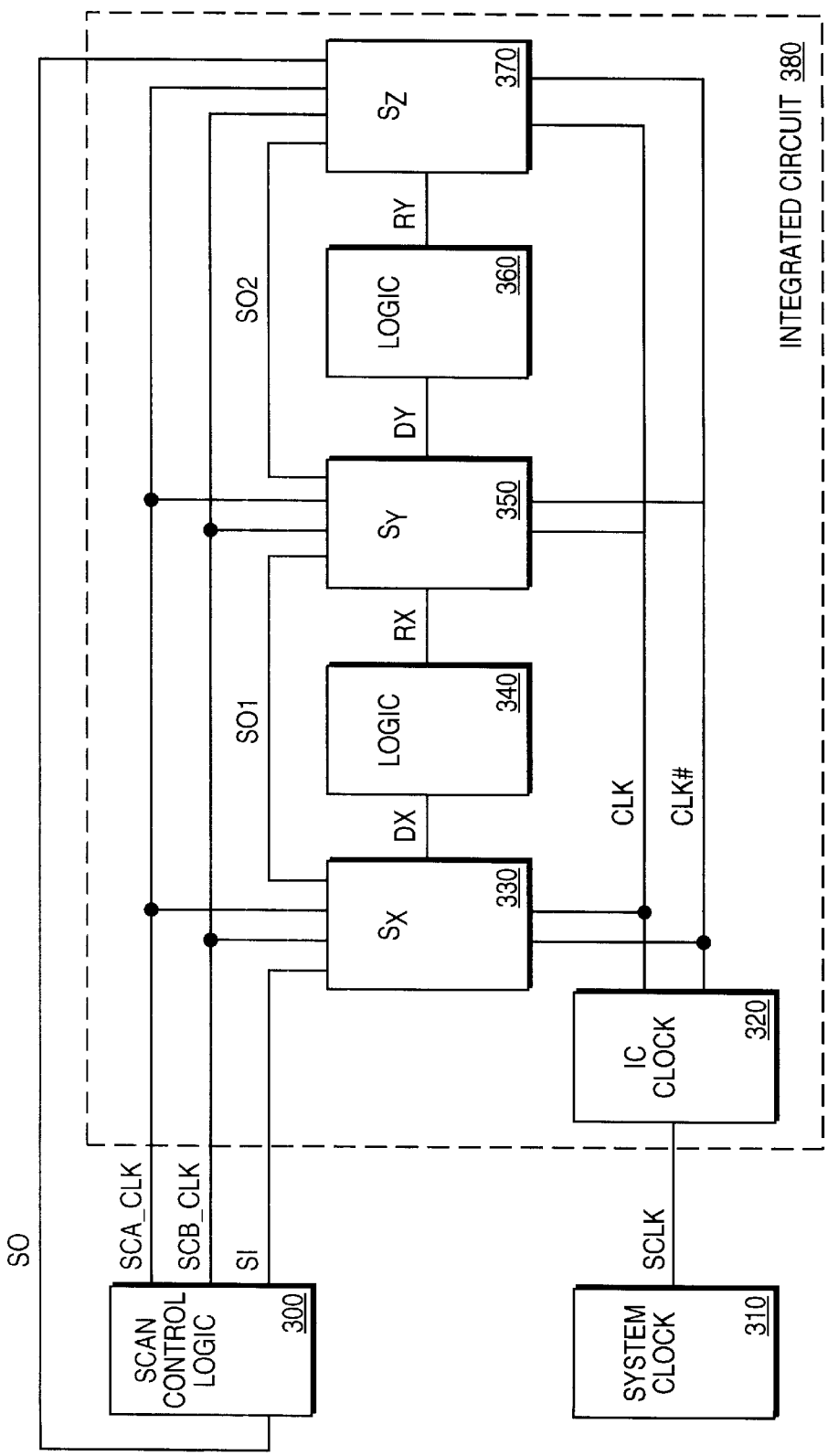
FIG. 3 illustrates one embodiment of system comprising a scan cell of the present invention.

FIG. 3 illustrates a system of the present invention.

A scan control logic 300 is used to generate the SI signal, the SCA_CLK signal, and the SCB_CLK signal corresponding to scan clocks for stuck at and delay fault tests. The scan control logic 300 is also coupled to receive a scan out (SO) signal which is used to capture the response data from the tests for comparison with the expected data. A system clock 310 is used to generate a system clock (SCLK) signal for the system. In one embodiment, some stimulus is applied to the external signals of the integrated circuit 380 to prepare the inputs of the combinational logic blocks for the test Typically, the scan control logic 300 comprises a memory that stores data to be scanned in via the SI signal and expected responses to be compared against the data to be scanned out via the SO signal. The data to be scanned in and the expected responses are typically generated by an automatic test pattern generator (ATPG) program on a computer system. This data is then transferred to the memory of the scan control logic 300.

An integrated circuit 380 is coupled to receive the SI signal, the SCA_CLK signal, the SCB_CLK signal, and the SCLK signal to generate the SO signal. An integrated circuit (IC) clock 320 is coupled to receive the SCLK signal and generate the non-overlapping independently controlled clock (CLK) and clock bar (CLK#) signals. The IC clock 320 comprises logic to deassert the CLK and CLK# signals simultaneously during stuck at and delay fault testing. In one embodiment, the IC clock 320 generates independently controlled CLK and CLK2# signals which may overlap as a result of clock skew. A race prevention circuit is implemented within each scan cell to provide the non-overlapping independently controlled CLK and CLK# signals for that scan cell as previously described.

A scan cell 330, a scan cell 350, and a scan cell 370 are coupled to receive the SCA_CLK signal, the SCB_CLK signal, the CLK signal, and the CLK# signal and operate as described above. The scan cell 330 is coupled to receive the SI signal from the scan control logic 300 and generate an scan-out1 (SO1) signal. The scan-input of the scan cell 350 is coupled to receive the SO1 signal and generate a scan-out2 (SO2) signal. The scan input of scan cell 370 is coupled to receive the SO2 signal and generate the SO signal.

The Q signal of scan cell 330 is coupled to an input of logic 340 ($D_x$). The D signal of scan cell 350 is coupled to receive an output of logic 340 ($R_x$). The $R_x$ signal is responsive to the $D_x$ input under certain test conditions. The Q signal of scan cell 350 is coupled to an input of logic 360 ($D_y$). The D signal of scan cell 370 is coupled to receive an output of logic 360 ($R_y$) The $R_y$ signal is responsive to the $D_y$ input under certain test conditions.

Figure 4:
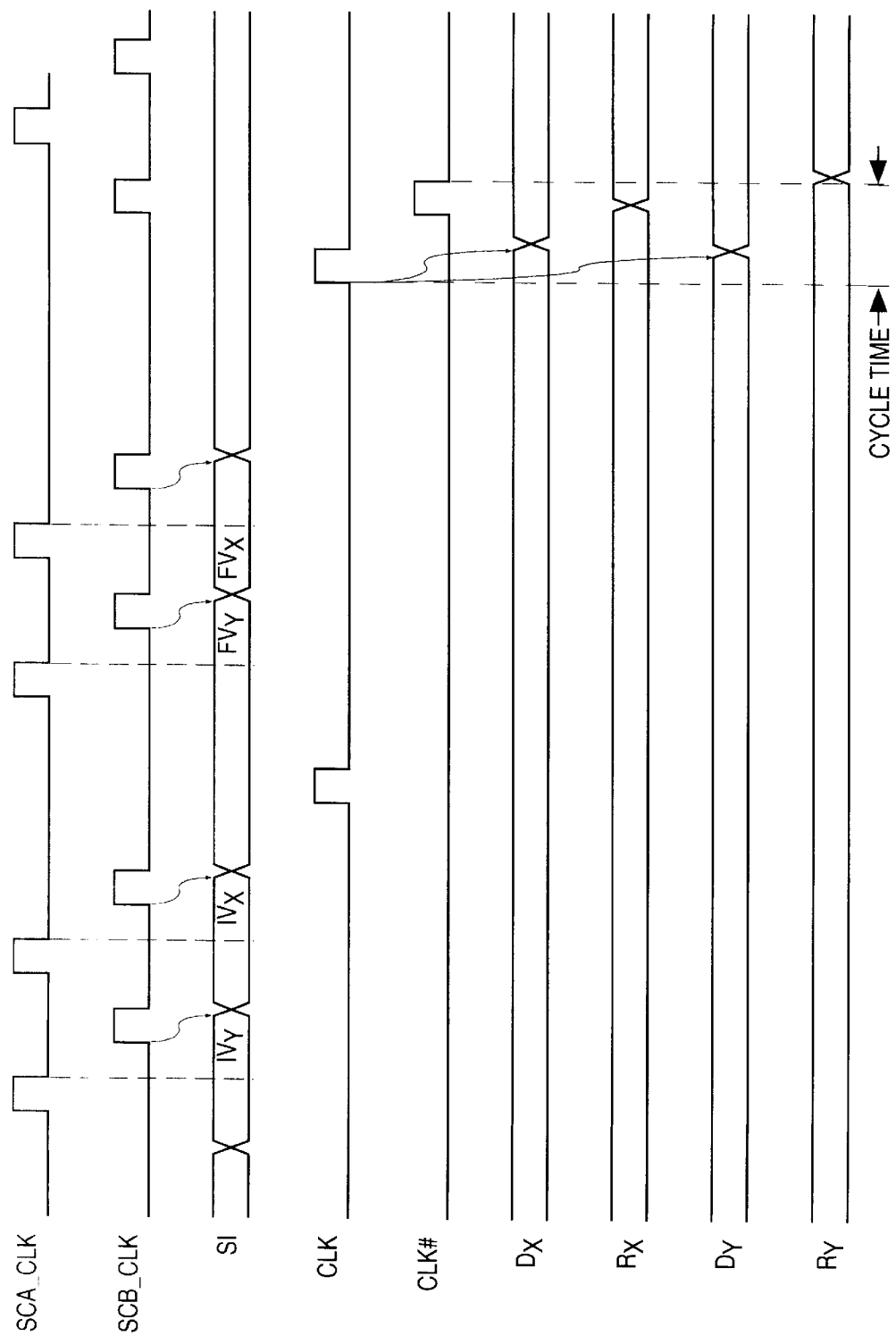
FIG. 4 illustrates one embodiment of a timing diagram of the present invention.

FIG. 4 illustrates a timing diagram of the embodiment of FIG. 3.

The SCA_CLK is asserted while the initial value for $D_y$ ($IV_y$) is driven on the SI signal. This causes the master latch of scan cell 330 to latch the $IV_y$ signal. The SCB_CLK is asserted to cause the scan slave latch of scan cell 330 to latch the $IV_y$ signal onto the SO1 signal. The SCA_CLK is asserted while the initial value for $D_x$ ($IV_x$) is driven on the SI signal. This causes the master latch of scan cell 330 to latch the $IV_x$ signal and the master latch of scan cell 350 to latch the $IV_y$ signal. The SCB_CLK is asserted to cause the scan slave latch of scan cell 330 to latch the $IV_x$ signal onto the SO1 signal and the scan slave latch of scan cell 350 to latch the $IV_y$ signal onto the SO2 signal.

A first pulse of the CLK signal is produced. The CLK signal causes the slave latch of scan cell 330 to latch the $IV_x$ signal onto the $D_x$ input to logic 340 and the slave latch of scan cell 350 to latch the $IV_y$ signal onto the $D_y$ input to logic 360.

The SCA_CLK is asserted while the final value for $D_y$ ($FV_y$) is driven on the SI signal. This causes the master latch of scan cell 330 to latch the $FV_y$ signal. The SCB_CLK is asserted to cause the scan slave latch of scan cell 330 to latch the $FV_y$ signal onto the SO1 signal. The SCA_CLK is asserted while the final value for $D_x$ ($FV_x$) is driven on the SI signal. This causes the master latch of scan cell 330 to latch the $FV_x$ signal and the master latch of scan cell 350 to latch the $FV_y$ signal. The SCB_CLK is asserted to cause the scan slave latch of scan cell 330 to latch the $FV_x$ signal onto the SO1 signal and the scan slave latch of scan cell 350 to latch the $FV_y$ signal onto the SO2 signal.

A second pulse of the CLK signal is produced. The CLK signal causes the scan cell 330 to latch the $FV_x$ signal onto the $D_x$ input to logic 340 and the scan cell 350 to latch the $IV_y$ signal onto the $D_y$ input to logic 360. This causes the $D_x$ and $D_y$ signals to transition from the corresponding initial values to the corresponding final values.

A first pulse of the CLK# signal is produced. The CLK# signal causes the scan cell 350 to latch the $R_x$ signal output of logic 340 and the scan cell 370 to latch the $R_y$ signal output of logic 360. The time between the rising edge of the second pulse of the CLK signal (when the transition is applied to the combinational logic) and the falling edge of the first pulse of the CLK# signal (when the latch which samples the response is closed) is gradually reduced and the test repeated until the device does not produce the expected values. In FIG. 4, the $R_x$ signal transitions before the falling edge of the CLK# signal but the $R_y$ signal does not transition until after the falling edge of the CLK# signal. The $R_x$ value would be sampled as the expected value (assuming the transition is expected) but the $R_y$ value would be sampled as an incorrect value (assuming the transition is expected) until the time is increased such that the falling edge of the CLK# signal occurs after the $R_y$ signal transitions.

The $R_x$ and $R_y$ signals may then be serially scanned out using a sequence of pulses of the SCA_CLK and SCB_CLK. The first assertion of the SCB_CLK causes the scan slave latch of scan cell 350 to latch the $R_x$ signal and the scan slave latch of scan cell 370 to latch the $R_y$ signal. The scan cell 370 drives the $R_y$ signal onto the SO signal which is received by the scan control logic 300. The assertion of the SCA_CLK causes the master latch of scan cell 370 to latch the $R_x$ signal and the second assertion of the SCB_CLK causes the slave latch of scan cell 370 to latch the $R_x$ signal. The scan cell 370 drives the $R_x$ signal onto the SO signal which is received by the scan control logic 300.

Figure 5:
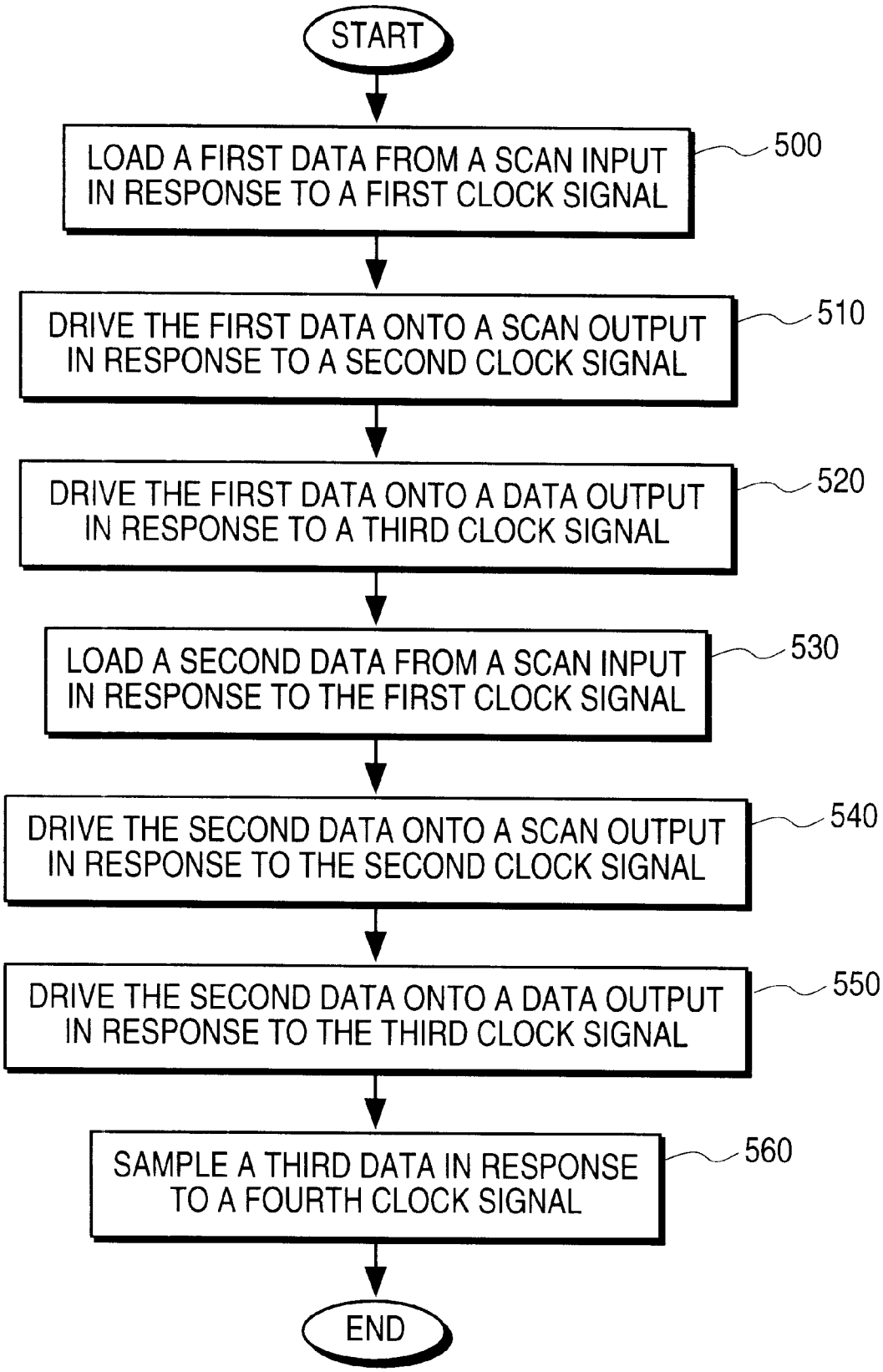
FIG. 5 illustrates one embodiment of a method of performing scan test.

FIG. 5 illustrates one embodiment of a method of the present invention.

In step 500, a first data is loaded from a scan input in response to a first clock signal. In one embodiment, the first clock signal is a scan clock signal that is used to load a master latch in each scan cell.

In step 510, the first data is loaded onto a scan output in response to a second clock signal. In one embodiment, the second clock signal is a scan clock signal that is used to load a scan slave latch in each scan cell.

In step 520, the first data is loaded onto a data output in response to a third clock signal. In one embodiment, the third clock signal is one phase of a system clock signal that is used to load a slave latch in each scan cell.

In step 530, a second data is loaded from a scan input in response to a first clock signal. In one embodiment, the first clock signal is a scan clock signal that is used to load a master latch in each scan cell.

In step 540, the second data is loaded onto a scan output in response to a second clock signal. In one embodiment, the second clock signal is a scan clock signal that is used to load a scan slave latch in each scan cell.

In step 550, the second data is loaded onto a data output in response to a third clock signal. In one embodiment, the third clock signal is one phase of a system clock signal that is used to load a slave latch in each scan cell. This causes the output of the slave latch to transition from the value of the first data to the value of the second data should those values be different. This transition is used as the stimulus to a combinational logic block.

In step 550, a third data is sampled in response to a fourth clock signal. In one embodiment, the fourth clock signal is one phase of a system clock signal that is used to load a master latch in each scan cell. This third data is the response of the combinational logic block to a stimulus applied by another scan cell.

What is claimed is:

1. A scan cell having a scan input, a scan output, a data input, a data output, a first and second scan clock and a first and second data clock, said scan cell being configured to perform delay fault testing wherein said first data clock and said second data clock are independently controlled so that both said first and second data clocks can be de-asserted at the same time.

2. The scan cell of claim 1 wherein during normal operation said first and second data clocks are alternately asserted.

3. The scan cell of claim 1 wherein said scan cell is a non-destructive scan cell.

4. A scan cell comprising:
   a first latch coupled to receive a first data, a second data, a first clock, and a second clock, said first latch latches said first data onto a first output in response to a first event on said first clock and latches said second data onto said first output in response to a second event on said second clock, a third signal being driven on said first output;
   a second latch coupled to receive said third signal and a third clock, said third signal being latched onto a data output in response to a third event on said third clock; and
   a third latch coupled to receive said third signal and a fourth clock, said third signal being driven on said scan output in response to a fourth event on said fourth clock, said first clock and said third clock being independently controlled.

5. The scan cell of claim 4 further comprising a race prevention circuit to prevent said first clock and said third clock from being simultaneously asserted.

6. The scan cell of claim 4 wherein said first clock and said third clock may be simultaneously deasserted.

7. A system comprising:
   a first logic, said first logic generates events on a first clock and a third clock, said first clock and said third clock being independently controlled;
   a second logic, said second logic generates a first data, a second clock, and a fourth clock; and
   a scan cell comprising:
      a first latch coupled to receive a first data, a second data, a first clock, and a second clock, said first latch latches said first data onto a first output in response to a first event on said first clock and latches said second data onto said first output in response to a second event on said second clock, a third signal being driven on said first output;
      a second latch coupled to receive said third signal and a third clock, said third signal latches onto a data output in response to a third event on said third clock; and
      a third latch coupled to receive said third signal and a fourth clock, said third signal being driven on said scan output in response to a fourth event on said fourth clock, said first clock and said third clock being independently controlled.

8. The scan cell of claim 7 further comprising a race prevention circuit to prevent said first clock and said third clock from being simultaneously asserted.

9. The scan cell of claim 7 wherein said first clock and said fourth clock may be simultaneously deasserted.

10. A method for performing a scan operation comprising the steps of:
    loading a first data in response to a first event on a first clock signal and a second event on a second clock signal;
    driving said first data onto a data output in response to a third event on a third clock signal;
    loading a second data in response to a fourth event on said first clock signal and a fifth event on said second clock signal; and
    causing a transition from said first data to said second data on said data output in response to a sixth event on said third clock signal.

11. The method of claim 10 further comprising the steps of:
    generating a third data in response to said second data; and
    loading said third data in response to a seventh event on fourth clock signal.

12. The method of claim 10 wherein said third clock signal and said fourth clock signal are independently controlled.

13. The scan cell of claim 2 wherein there is a period of time between each assertion of the first and second data clocks in which neither the first or second data clocks is asserted.

* * * * *